United States Patent [19]
Ohtani et al.

[11] Patent Number: 5,966,596
[45] Date of Patent: Oct. 12, 1999

[54] METHOD OF FABRICATING SEMICONDUCTOR DEVICES BY CRYSTALLIZING AMORPHOUS SILICON WITH NICKEL

[75] Inventors: Hisashi Ohtani; Toru Mitsuki, both of Kanagawa, Japan

[73] Assignee: Semiconductor Energy Laboratory Co., Ltd., Kanagawa-ken, Japan

[21] Appl. No.: 08/757,112

[22] Filed: Dec. 2, 1996

[30] Foreign Application Priority Data

Nov. 30, 1995 [JP] Japan ................................. 7-338130

[51] Int. Cl.⁶ ........................................... H01L 29/04
[52] U.S. Cl. ............................................ 438/155; 438/163
[58] Field of Search ................................. 438/155, 163, 438/166, 486, 487, 308, 795

[56] References Cited

U.S. PATENT DOCUMENTS

| | | | |
|---|---|---|---|
| 5,147,826 | 9/1992 | Liu et al. | 438/233 |
| 5,529,937 | 6/1996 | Zhang et al. | 437/10 |
| 5,569,610 | 10/1996 | Zhang et al. | 437/21 |
| 5,621,224 | 4/1997 | Yamazaki et al. | |
| 5,693,541 | 12/1997 | Yamazaki et al. | 437/21 |
| 5,744,824 | 4/1998 | Kousai et al. | |
| 5,756,364 | 5/1998 | Tanaka et al. | |
| 5,773,846 | 6/1998 | Zhang et al. | |
| 5,817,549 | 10/1998 | Yamazaki | |

OTHER PUBLICATIONS

Kawazu, Japanese Journal of Applied Physics:vol. 29 No. 12 Dec. 1990 pp. 2698–2704 "Low–Temperature Crystallization of Hydrogenated Amorphous Silicon Induced by Nickel Silicide Formation".

Kawazu, Japanese Journal of Applied Physics:vol. 29 No. 4 Apr. 1990 pp. 729–738 "Initial Stage of the Interfacial Reaction between Nickel and Hydrogenated Amorphous Silicon".

Hayzelden, Journal of Applied Physics: 73 (12), Jun. 15, 1993 pp. 8279–8289 "Silicide Formation and Silicide–Mediated Crystallization of Nickel Implanted Amorphous Silicon Thin Films".

Kuo, The Electrochemical Society Proceedings: vol. 94–35 pp. 116–122 "Thin Film Transistor Technologies", Apr. 1995.

Liu, Applied Physics Letters 55 (7) Aug. 14, 1989 pp. 660–662 "Selective area crystallization of amorphous silicon films by low–temperature rapid thermal annealing".

Cuane, Applied Surface Science 36 (1989) pp. 597–604 "Combined CW Laser and Furnace annealing of Amorphous Si and Ge in Contact With Some Metals", Jan. 1989.

Wolf, Silicon Processing for the VLSI Era, viol. 21986 pp. 273–275 "Passivation Layers", Jan. 1986.

*Primary Examiner*—Charles Bowers
*Assistant Examiner*—Martin Sulsky
*Attorney, Agent, or Firm*—Fish & Richardson P.C.

[57] ABSTRACT

Method of fabricating TFTs (thin-film transistors) having a crystallized silicon film and a gate-insulating film. First, an amorphous silicon film is formed on an insulating substrate. A first dielectric film is formed from silicon oxide on the amorphous silicon film. Holes are formed in the first dielectric film to selectively expose the surface of the amorphous silicon film. Nickel is introduced as the metal element into the amorphous silicon film. The film is heat-treated, thus forming crystallized silicon film. This crystalline silicon film is etched together with the silicon oxide film to form an active layer. The etched silicon oxide film acts as the aforementioned gate-insulating film. Even after the crystallization step, the silicon oxide film is left behind. As a result, the interface with the crystalline silicon film is kept in a good state.

24 Claims, 6 Drawing Sheets

METHOD OF FABRICATING SEMICONDUCTOR DEVICES BY CRYSTALLIZING AMORPHOUS SILICON WITH NICKEL

BACKGROUND OF THE INVENTION

1. Field of the Invention

The present invention relates to a method of fabricating semiconductor devices such as thin-film transistors (TFTs) and, more particularly, to a method of fabricating semiconductor devices using a silicon film which is crystallized by the catalytic action of a metal element.

2. Description of the Related Art

In recent years, a configuration using TFTs as liquid crystal devices has attracted attention. This is known as an active matrix liquid crystal display and has millions of pixels arranged in rows and columns. TFTs are connected with each pixel. This liquid crystal display is characterized in that the manner in which electric charge is stored in pixels and transmitted out of them is controlled by these TFTs. This active matrix liquid crystal display is capable of providing a display with high information content and at a high speed. Consequently, the active matrix liquid crystal display is used in portable wordprocessors and computer displays.

Although amorphous silicon film is conveniently used as a silicon film incorporated in TFTs, the electrical characteristics of the amorphous silicon film are much poorer than those of single-crystal semiconductor used in a semiconductor integrated circuit. Therefore, TFTs using the amorphous silicon film can be used only in limited applications such as switching devices in active matrix circuits.

In order to improve the characteristics of a TFT, a silicon film having crystallinity may be used. Besides single-crystal silicon, polycrystalline silicon film and crystallite silicon film are known as silicon films having crystallinity. In order to obtain a silicon film having such crystallinity, an amorphous silicon film is grown and then heated by thermal annealing to crystallize the amorphous film. This method is known as solid phase epitaxy, because the crystal state is changed from amorphous state to crystalline state while the solid phase is maintained.

Generally, liquid crystal displays are required to use substrates having transparency and so limitations are imposed on the substrate material. Generally, a material which satisfies the various requirements, i.e., it has transparency, is cheap, and provides a large area, is only glass.

Where silicon is grown by solid phase epitaxy, the heating temperature is above 600° C. and the heating time is more than 10 hours. Corning 7059 glass which is widely accepted into general use has a strain point of 593° C. Where increases in area of substrates are taken into account, it is difficult to perform thermal annealing above 600° C.

Process Leading to the Invention

In view of these problems, we have conducted researches. We have found that if a trace amount of a metal element is added to an amorphous silicon film, crystallization of silicon is promoted by the catalytic action of the metal element, and that the crystallization temperature can be lowered and the crystallization time can be shortened. More specifically, we have discovered that silicon can be crystallized by performing a heat-treatment at 550° C. for about 4 hours. Therefore, TFTs using a crystalline silicon film can be fabricated on a glass substrate.

One or more elements selected from the group consisting of Fe, Co, Ni, Ru, Rh, Pd, Os, Ir, Pt, Cu, and Au can be appropriately selected as the aforementioned metal element producing catalytic action. Among them, nickel (Ni) produces especially conspicuous crystallization effect.

Methods for introducing metal elements into amorphous silicon film include (i) a method consisting of bringing a coating, particles, clusters, or the like including a metal element into intimate contact with an amorphous silicon film, (ii) a method of consisting of applying an aqueous solution containing a metal element, and (iii) an ion implantation method. An amorphous silicon film in which a metal element has been introduced is crystallized by heating the film at a temperature of 450–580° C. for 4 to 8 hours.

As a result of our research, we have elucidated the crystallization process of silicon where a metal element is added. That is, heating causes amorphous silicon to react with the metal element, thus forming silicide. Then, silicon is heteroepitaxially grown on the surface of the silicide which acts as embryos. The dimensions of embryos of silicide depend on thermal factors, the thickness of the amorphous silicon, and other factors. Where nickel is used as a metal element, the dimensions are on the order of 500–2000 Å. Therefore, obtained silicon crystals are pillar-shaped crystals having widths comparable to those of the embryos. The crystals grow from regions in which the metal element has been introduced toward the surroundings. Consequently, the crystal growth can be controlled by controlling the regions in which the metal element is introduced and their shapes.

FIGS. 6(A)–6(D) illustrate the prior art process of crystallization of silicon, utilizing the catalytic action of a metal element, for explaining its mechanism elucidated by us. As shown in FIG. 6(A), a buffer layer 12 consisting of silicon oxide and an amorphous silicon film 13 are formed over a glass substrate 11.

Then, a silicon oxide film 14 is formed to a thickness of 500 to 2000 Å. A hole 14a is formed in the film. Typically, the hole 14a takes a rectangular form extending in a direction vertical to the plane of the figure.

In the hole 14a, a thin oxide film (not shown) is formed on the surface of the amorphous silicon film 13 to a thickness of about 10 to 50 Å. This thin oxide film improves the surface characteristics of the amorphous silicon film 13 and thus the amorphous silicon film no longer repels water. The thin oxide film can be formed by ultraviolet radiation within an oxygen ambient or immersing the substrate in ozone water or hydrogen peroxide water.

In order to introduce nickel, which is a metal element for promoting crystallization of silicon, into the amorphous silicon film 13 under this condition, aqueous solution of nickel acetate is applied by spin coating and dried. As a result, an extremely thin nickel film 15 is formed in intimate contact with the surface of the amorphous silicon film 13 in the hole 14a within the silicon oxide film 14.

As shown in FIG. 6(B), the laminate is heat-treated at a temperature of 450 to 640° C. for 4 to 8 hours, typically at 550° C. for 8 hours. Crystals are grown from the regions with which the extremely thin nickel film 15 is in contact in directions parallel to the substrate 11 indicated by the arrows. As a result, a crystalline silicon film 16 is formed. The crystal growth depth can be set to tens of micrometers to 100 μm or more. Where a glass substrate is used as the substrate, the heating temperature is preferably set below the strain point of the glass substrate in order to prevent the glass substrate from shrinking or deforming.

As shown in FIG. 6(C), after the crystal growth, the silicon oxide film 14 is removed. Thereafter, if necessary, laser annealing may be performed to improve the crystallinity of the crystalline silicon film 16. This crystalline silicon film 16 has a region 16a located immediately under the thin nickel film 15. In this region 16a, crystals are grown vertical to the glass substrate 11. The crystallographic axis is not uniform. This growth is referred to as vertical growth. On the other hand, in a region 16b located around the vertical growth region 16a, crystals are grown parallel to the glass substrate 11 with a substantially uniform crystallographic axis. This crystal growth is referred to as lateral growth.

As shown in FIG. 6(D), the crystalline silicon film 16 is patterned to form an active layer 17 for TFTs. A silicon oxide film 18 acting as a gate-insulating film is formed. The TFTs are completed by well-known fabrication techniques. The region located just under the extremely thin nickel film 15 and the regions in which the crystal growth terminates are heavily doped with nickel and so it is necessary that these regions be not contained in the channel formation region.

Silicon crystals can be grown parallel to the substrate 11, i.e., laterally, as shown in FIG. 6(B), by adopting the above-described crystallization techniques. Since the directions of crystals of the obtained crystalline silicon film 16 are uniform, TFTs using this crystalline silicon film 16 show good electrical characteristics and are capable of operating at high speeds.

In the above-described crystallization step, however, after obtaining the crystalline silicon film 16, the mask 14 is removed, and the surface of the crystalline silicon film 16 is exposed. Therefore, there is the possibility that the surface is contaminated. Furthermore, ridges might be formed because the laser annealing is carried out while the surface of the crystalline silicon film 16 is exposed. The contamination and the ridges will raise the energy levels at the interface between the active layer 17 and the gate-insulating film. Hence, the characteristics of the TFTs are deteriorated.

SUMMARY OF THE INVENTION

It is an object of the present invention to provide a method of fabricating semiconductor devices having good active layer interface levels by solving the foregoing problems.

In order to solve the foregoing problems, a semiconductor device fabrication method according to the present invention comprises the steps of: forming a first dielectric film on the aforementioned silicon film; forming holes in the dielectric film to selectively expose a surface of the amorphous silicon film; introducing the aforementioned metal element into the amorphous silicon film from the exposed surface; crystallizing the amorphous silicon film to form a crystalline silicon film; etching the amorphous silicon film together with the first dielectric film to form an active layer; and forming a second dielectric film.

In the aforementioned method of fabricating semiconductor devices, the amorphous silicon film formed on the dielectric substrate is crystallized by making use of catalytic action of the metal element. In this step, the metal element is selectively introduced into the amorphous silicon film. For this purpose, the first dielectric film is used as a barrier film. The holes are selectively formed in the first dielectric film to partially expose the surface of the amorphous silicon film.

The step of introducing the metal element into the amorphous silicon film can utilize a step of applying a solution containing the metal element to the amorphous silicon film. The use of the solution facilitates controlling the concentration of the metal element in the amorphous silicon film. Furthermore, the metal element can be retained in contact with the amorphous silicon film uniformly.

In order to crystallize the silicon by heat-treatment, it is necessary to introduce the metal element into the amorphous silicon film at a concentration of more than $1\times10^{16}$ cm$^{-3}$. However, if the metal element is introduced in the amorphous silicon film at a concentration of more than $5\times10^{19}$ cm$^{-3}$, silicide is formed in the film with undesirable results.

The step of forming the crystalline silicon film can consist of heat-treating it at a temperature of about 450 to 600° C. The heating diffuses the metal element. Concomitantly, the crystalline silicon film is grown laterally, thus forming the crystalline silicon film.

In order to diffuse the metal element into the amorphous silicon film, the heating temperature must be higher than 400° C. The upper limit of the heating temperature is limited by the maximum allowable temperature of the substrate, i.e., its strain point. For example, where a glass substrate is employed, setting the heating temperature to about 550° C. is appropriate from the viewpoint of the heatproofness of the glass substrate and the productivity. Where a substrate of a material withstanding a temperature of 1000° C. or higher such as quartz substrate is used, the heating temperature can be elevated with increasing the maximum allowable temperature.

The present invention is characterized in that the active layer can be formed by etching the crystalline silicon film without removing the first dielectric film acting as a masking film; rather the first dielectric film is left on the crystalline silicon film. Thus, the surface of the silicon film forming the active layer remains coated with the first dielectric film during a time interval between the formation of the first dielectric film and the completion of the semiconductor devices. Consequently, the surface is protected from contamination. The interface between the gate-insulating film and the active layer can exhibit good characteristics.

After forming the active layer, the second dielectric film is formed. As a result, the gate-insulating film consisting of the two layers, i.e., the first and second dielectric films, is formed. Therefore, the first and second dielectric films may be made of silicon oxide or silicon nitride. However, the first dielectric film is required to be so thick that it functions as a barrier film when a metal element is introduced. For example, where the first dielectric film is formed from silicon oxide, a film thickness of tens of angstroms is necessary. In practical applications, the film thickness is set to several hundreds of angstroms.

With respect to the first dielectric film, if the amorphous silicon film is thermally oxidized into a silicon thermal oxide film, the characteristics of the interface between the active layer (crystalline silicon film) and the gate-insulating film (first dielectric film) can be made better than those of the interface between the crystalline silicon and the CVD silicon oxide film. The thermal oxidization can be performed by wet oxidation or hydrogen chloride oxidation. It is to be noted that the heating temperature, the heating time, and other conditions are required to be set in such a way that the amorphous silicon film is not crystallized and that the used substrate is not deformed.

If a sufficient film thickness is not obtained by the thermal oxidation method, a silicon oxide film or silicon nitride film is deposited by chemical vapor deposition on the thermal oxide silicon film to impart a sufficient film thickness to the first dielectric film.

In the novel semiconductor device fabrication method, a laser irradiation step (i.e., a laser annealing step) can be performed after the step of forming the crystalline silicon film. This can improve the crystallinity of the crystalline silicon film. At this time, the first dielectric film exists on the surface of the crystalline silicon film. This acts to suppress ridges formed by the laser annealing.

Measurements with an AFM have revealed that where no capping layer existed as in the prior art techniques, the sizes of the ridges were about 500 Å, and that where a capping layer consisting of the silicon oxide film according to the invention existed, the sizes of the ridges were less than about 200 Å. Generation of the ridges can be suppressed by subjecting the crystalline silicon film to laser annealing while it is capped with the first dielectric film.

In another feature of the invention, the first dielectric layer acts not only as the capping layer for suppressing generation of the ridges but also as an antireflective film for laser light. This can more effectively supply the laser energy to the crystalline silicon.

The laser irradiation induces multiple reflection at the interface between the first dielectric film and the crystalline silicon film and, therefore, the reflectivity of the surface of the first dielectric film depends on the thickness of the first dielectric film. Consequently, energy can be more effectively given to the crystalline silicon film by appropriately setting the thickness of the first dielectric film than where laser light is made to directly impinge the surface of the crystalline silicon film.

More specifically, light having a wavelength of 248 nm emitted by a KrF excimer laser was directed to the silicon oxide layer and the silicon nitride layer on the polycrystalline silicon film in air. The intensities of two kinds of light reflected from the silicon oxide layer and the silicon nitride layer were calculated. The results are shown in FIG. 5, where the thickness of silicon oxide film is plotted on the horizontal axis and the theoretical values of reflected light is plotted on the vertical axis. As can be seen from the graph of FIG. 5, the intensity of reflected light varies in a sinusoidal relation to the film thickness. Since the phase depends also on the wavelength of the illuminating light, a curve indicating the intensities of reflected light having a wavelength of 308 nm, for example, emitted by an XeCl excimer laser is substantially equal to a curve obtained by translating the aforementioned curve tens of nanometers along the horizontal axis.

The silicon oxide film and the silicon nitride film may be made to act as antireflective films by controlling the film thickness in such a way that the intensity of reflected light assumes its minimum value. However, if the first dielectric film is too thick, the laser energy cannot sufficiently reach the crystalline silicon film and so the laser annealing does not produce satisfactory effects. Furthermore, it is impossible that the first dielectric film acts as the gate-insulating film.

Where these considerations are taken into account, it can be seen from FIG. 5 that the thickness of the silicon oxide film should be set to about 300 to 500 Å and the thickness of the silicon nitride film be set to 250 to 400 Å for laser light emitted by the KrF excimer laser. However, the intensities of light shown in FIG. 5 have been obtained theoretically. The actual reflected light intensity varies, depending on the reflectivity of the film and on the used laser. The thickness of the first dielectric film consisting of silicon oxide film and silicon nitride film may be determined, taking these into consideration. For instance, where laser light having a wavelength of 248 nm is emitted from a KrF excimer laser, the thicknesses of the silicon oxide film and the silicon nitride film are set to 300–600 Å and 250–500 Å, respectively. Where laser light having a wavelength of 308 nm is illuminated from an XeCl excimer laser, the thicknesses of the silicon oxide film and the silicon nitride film are set to 400–700 Å and 350–600 Å, respectively.

In the step of forming the crystalline silicon film, the heat-treatment diffuses the metal element into the amorphous silicon film and very shallowly into the first dielectric film. In the present invention, the lamination of the first and second dielectric films forms the gate-insulating film. Therefore, if the first dielectric film is heavily doped with a metal element, then the characteristics of the gate-insulating film are deteriorated. For this reason, it is desired to remove the surface regions of the first dielectric film which are heavily doped with the metal element.

More specifically, the surface of the first dielectric film is cleaned by a megasonic process or other means. Then, the surface is etched to a depth of tens of angstroms to hundreds of angstroms with diluted HF solution. The etched film thickness may be appropriately determined according to the quality of the first dielectric film and the used metal. Furthermore, this step may be carried out after forming the crystalline silicon film. Where this step is effected before the laser annealing step, the etching may be performed in such a way that the first dielectric film acts as an antireflective film.

DETAILED DESCRIPTION OF THE PREFERRED EMBODIMENTS

EXAMPLE 1

FIGS. 1(A)–1(E) and 2(A)–2(D) are cross-sectional views illustrating the process sequence for fabricating a thin-film transistor (TFT) of the present example. In the present example, a silicon film is crystallized by using a solution containing nickel.

Figure 1A:
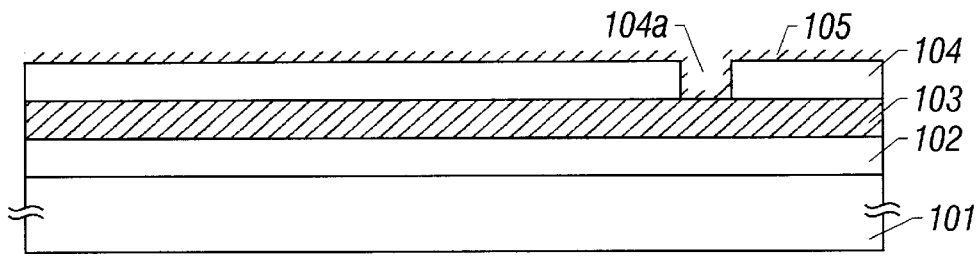
FIGS. 1(A)–1(E) and 2(A)–2(D) are cross-sectional views illustrating a process sequence for fabricating a TFT according to Example 1 of the present invention.

As shown in FIG. 1(A), a silicon oxide film is formed as a buffer layer 102 on a glass substrate 101 to a thickness of 3000 Å by sputtering techniques. Then, an amorphous silicon film 103 is formed on the buffer layer to a thickness of 500 Å by plasma CVD or LPCVD.

The surface of the amorphous silicon film 103 is oxidized to form a thin oxide film (not shown) having a thickness of about 10 to 50 Å. This thin oxide film improves the surface characteristics of the amorphous silicon film 103. The silicon film 103 no longer repels aqueous solution. In the present example, the laminate is illuminated with ultraviolet radiation in an oxygen ambient to form a thin oxide film (not shown) to a thickness of 20 Å.

Then, a silicon oxide film 104 is formed to a thickness of 400 to 800 Å by plasma CVD or LPCVD. Preferably, the buffer layer 102, the amorphous silicon film 103, and the silicon oxide film 104 are formed in succession. Because the interface between the amorphous silicon film 103 and the silicon oxide film 104 is retained as it is until the final TFT is completed, and because the characteristics of this interface affect the characteristics of the TFT, it is necessary to form the amorphous silicon film 103 and the silicon oxide film 104 with special care.

After forming the silicon oxide film 104, a rectangular hole 104a extending normal to the plane of figure is formed by a well-known etching process. During this etching process, alignment markers which act as indicia after the formation of the active layer can be formed.

The surface of the amorphous silicon film 103 which is exposed through the hole 104a in the silicon oxide film 104 is oxidized to form a thin oxide film (not shown) having a thickness of about 10 to 50 Å. This thin oxide film improves the surface characteristics of the amorphous silicon film 103 and thus the amorphous silicon film no longer repels water solution. In the present example, the film is illuminated with ultraviolet radiation within an oxygen ambient to form the thin oxide film (not shown) to a thickness of 20 Å.

Under this condition, a solution containing nickel which is a metal element promoting crystallization of silicon is applied. In the present example, aqueous solution of nickel acetate containing 10 ppm nickel is applied by spin coating and dried to form an extremely thin nickel acetate film 105. At this time, a thin oxide film (not shown) is present on the surface of the amorphous silicon film 103 in the hole 104a. Since the film thickness is as small as 20 Å, the surface of the amorphous silicon film 103 is substantially exposed. Hence, nickel is held in contact with the surface of the amorphous silicon film 103 in the hole 104a formed in the silicon oxide film 104.

Figure 1B:
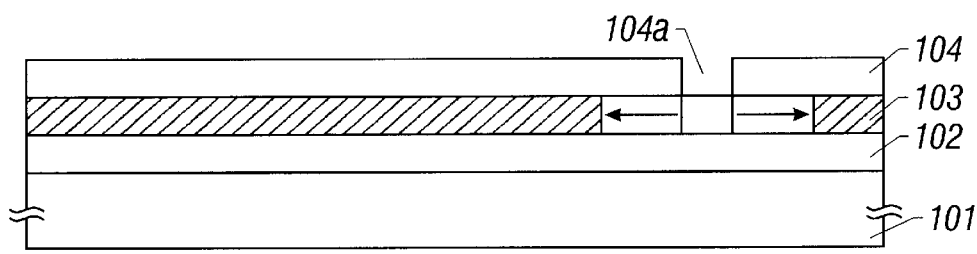
Figure 1C:
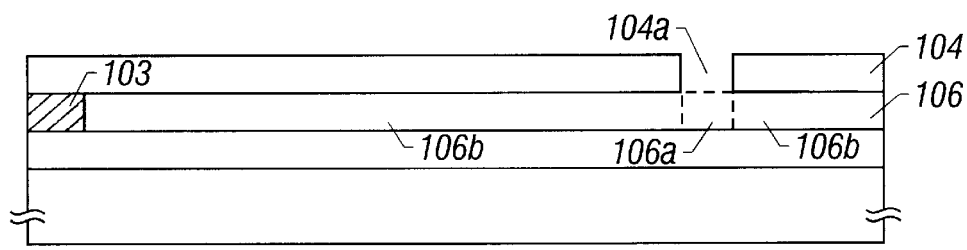

As shown in FIG. 1(B), a heat-treatment is performed at 550° C. for 8 hours in a nitrogen ambient. The thin nickel acetate film 105 is decomposed at 400° C., so that nickel element is diffused into the amorphous silicon film 103 through the hole 104a in the silicon oxide film 104. The amorphous silicon film 103 is crystallized laterally as indicated by the arrows, thus forming a crystalline silicon film 106. As shown in FIG. 1(C), in a region 106a located immediately under the thin nickel acetate film 105, crystals have been grown vertically. In its surrounding region 106b, crystals have been grown laterally. This heat-treatment may be carried out at 450 to 600° C. Where a glass substrate is used, this heat-treatment temperature is preferably set below the strain point of the glass substrate to prevent the glass substrate from shrinking or deforming.

Figure 5:
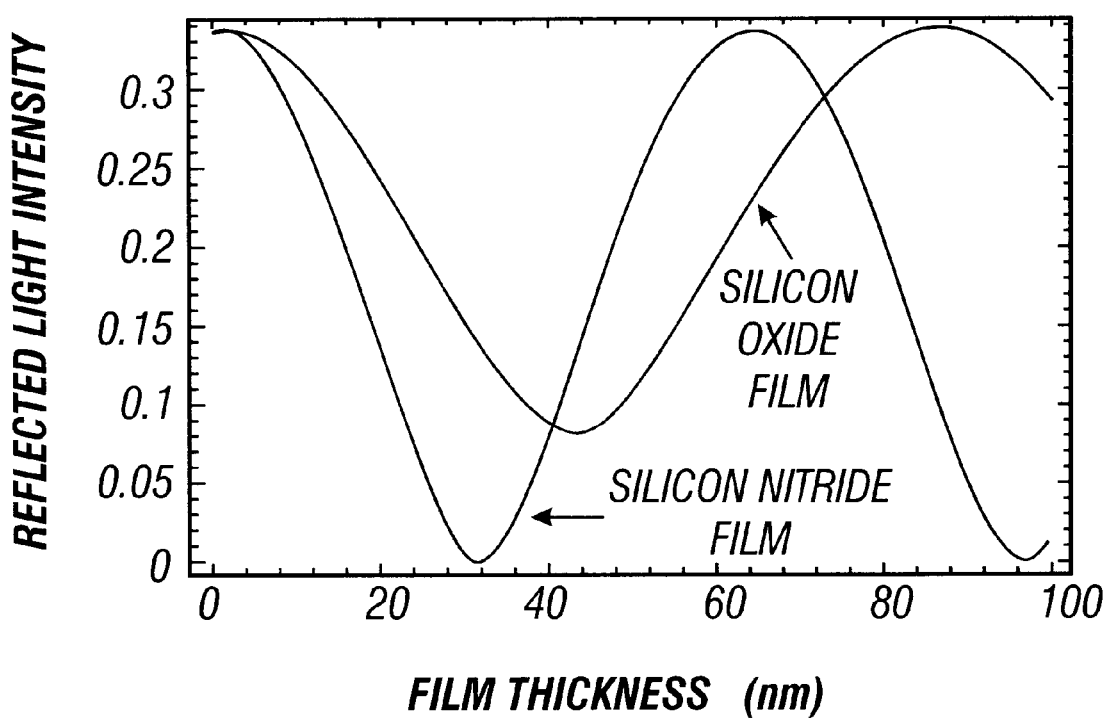
FIG. 5 is a graph showing theoretical curves of light reflected from silicon oxide film and silicon nitride film, respectively, against light having a wavelength of 248 nm.
Figure 6A:
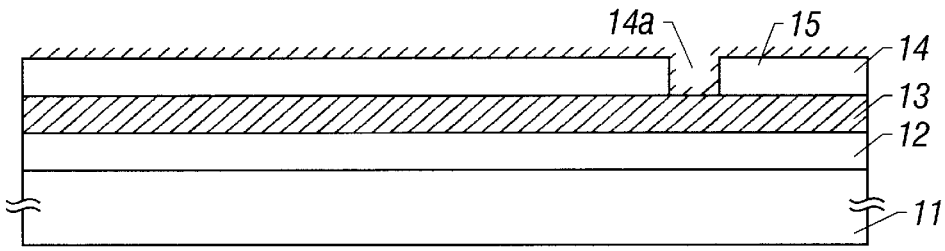
FIGS. 6(A)–6(D) are cross-sectional views illustrating the prior art steps for crystallizing a silicon film.
Figure 6B:
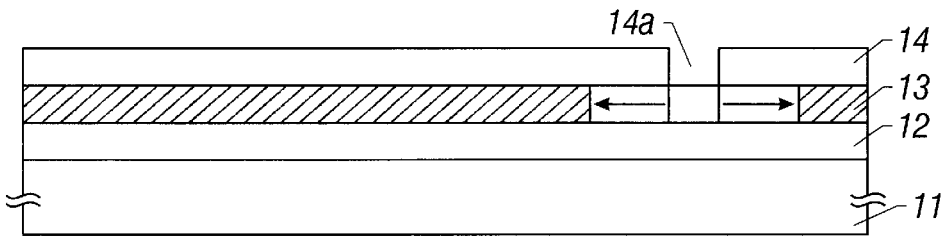
Figure 6C:
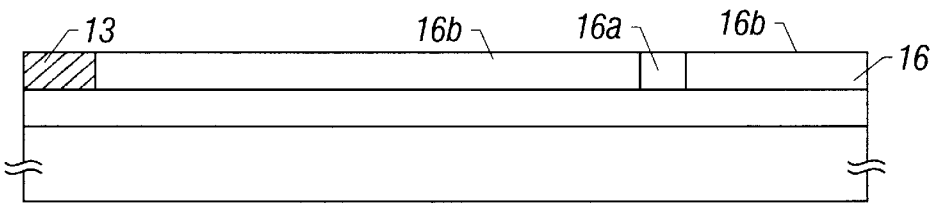
Figure 6D:
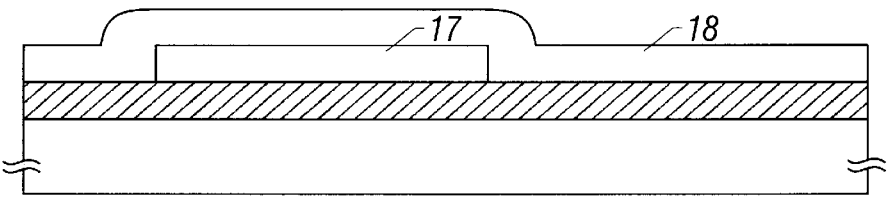

Then, as shown in FIG. 1(C), laser annealing is performed without removing the silicon oxide film 104 to improve the crystallinity of the crystalline silicon film 106 further. In the present example, laser light having a wavelength of 248 nm is emitted from a KrF excimer laser or laser light having a wavelength of 304 nm is emitted from an XeCl excimer laser. At this time, the silicon oxide film 104 is present on the surface of the crystalline silicon film 106 and so generation of ridges is suppressed. The thickness of the silicon oxide film 104 is set to 500 Å. The oxide film acts as an antireflective film for light having a wavelength of 248 nm as shown in FIG. 5. In consequence, laser energy can be efficiently given to the crystalline silicon film 106.

Before the laser annealing step, the surface of the silicon oxide film 104 which is heavily doped with nickel may be removed to a depth of tens of angstroms to hundreds of angstroms. In this case, the surface is first cleaned by a megasonic process and etched with diluted HF solution. During the etching, the thickness of the silicon oxide film 104 is so set that the film acts as an antireflective film for laser light. Therefore, the thickness of the silicon oxide film 104 may be determined, taking account of the depth achieved by this etching step.

Figure 1D:
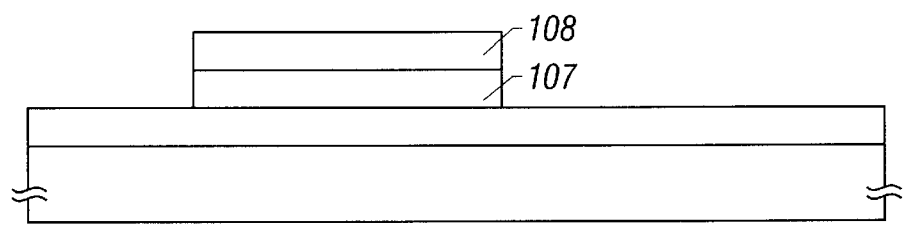
Figure 1E:
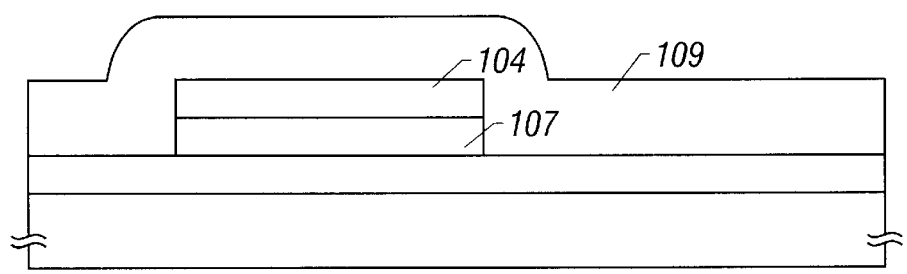

As shown in FIG. 1(D), the crystalline silicon film 106 is etched into islands while the silicon oxide film 104 is left on the silicon film, thus forming an active layer 107. The etched silicon oxide film 104 acts as a gate-insulating film. After the end of the etching, a silicon oxide film 109 is formed to a thickness of 1000 Å by plasma CVD or LPCVD. These silicon oxide films 104 and 109 together form a gate-insulating film.

In the present example, the lower layer of the gate-insulating film consists of the silicon oxide film 104. However, the lower layer may also consist of a silicon nitride film. In this case, the thickness of the silicon nitride film is controlled according to the wavelength of the laser light used during the laser annealing step so that this film acts as an antireflective film. Furthermore, instead of the silicon oxide film 109 as the upper layer of the gate-insulating film, a silicon nitride film may be deposited.

Figure 2A:
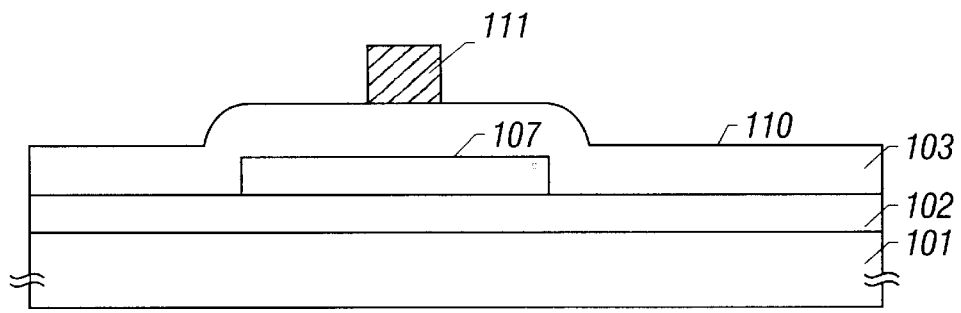

After forming the silicon oxide film 109, an aluminum film having a thickness of 4000 Å is formed on the surface of the gate-insulating film 110 consisting of the silicon oxide films 104 and 109, as shown in FIG. 2(A). The aluminum film is patterned to form a gate electrode 111. Formation of hillocks and whiskers is prevented during heating steps and other later steps by previously adding 0.2% by weight of scandium to the aluminum.

Figure 2B:
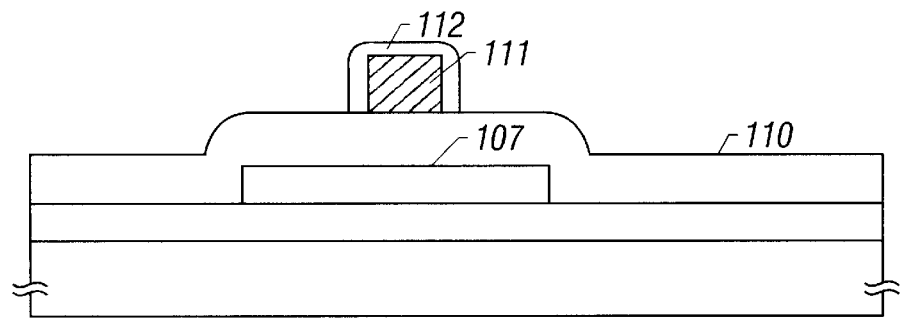

As shown in FIG. 2(B), an anodic oxide 112 having a thickness of 1500 to 2000 Å is formed around the gate electrode 111 by the anodization technique disclosed in Japanese Patent Laid-Open No. 267667/1993. In the present example, an electrolytic solution is prepared by neutralizing ethylene glycol solution containing 3% tartaric acid with aqueous ammonia to pH 6.9. Within this electrolytic solution, a voltage is applied, using the gate electrode 105 as an anode. As a result, the dense and firm anodic oxide 112 is formed around the gate electrode 111. The thickness of the anodic oxide 112 can be controlled by the voltage applied to the gate electrode 111.

Figure 2C:
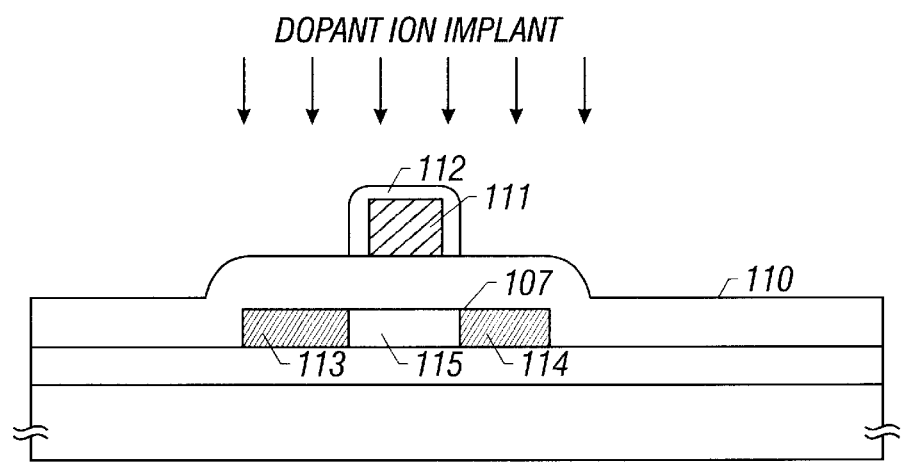

As shown in FIG. 2(C), dopant ions are implanted into the active layer 107 by ion implantation techniques, using the gate electrode 111 and surrounding anodic oxide 112 as a mask. In order to fabricate a P-channel TFT, phosphorus is introduced. Using phosphine (PH$_3$) as a dopant gas, phosphorus ions are implanted. On the other hand, in order to fabricate an N-channel TFT, boron ions are introduced, using diborane (B$_2$H$_6$) as a dopant gas. As a result, a source region 113, a drain region 114, and a channel region 115 are formed in the active layer 107 by self-aligned technology.

In the present example, the anodic oxide 112 is formed around the gate electrode 111. Therefore, the source region 113 and the drain region 114 are shifted from the ends of the gate electrode 111 by an amount equal to the thickness of the anodic oxide 112. That is, an offset structure can be formed. Since this offset structure acts as a high-resistivity region, the off current of the TFT can be reduced.

Figure 2D:
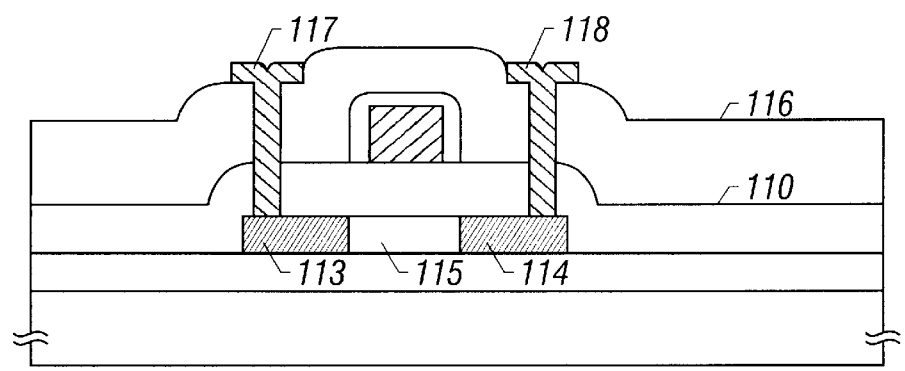

As shown in FIG. 2(D), a silicon oxide film is formed as an interlayer dielectric film 116 to a thickness of 6000 Å by plasma CVD. The interlayer dielectric film 116 consists of a single layer of silicon oxide. Instead, the film 116 can be made of a silicon nitride film or a multilayer film of silicon oxide and silicon nitride. The interlayer dielectric 116 and the gate-insulating film 110 are etched to form contact holes in the source region 113 and in the drain region 114. A multilayer film of titanium and aluminum is formed over these contact holes and patterned to form an upper metallization layer and electrodes, 117 and 118. Finally, the laminate is heat-treated at a temperature of 300° C. in a hydrogen ambient, thus completing the TFT.

In the present example, the surface of the active layer 107 (crystalline silicon film 106) is not exposed during a time interval between the instant when the silicon oxide 104 is formed and the instant when the TFT is completed. Therefore, the surface is prevented from getting contaminated. The layer can be made to act as a capping layer which suppresses formation of ridges that would normally be generated by laser annealing. Furthermore, the thickness of the silicon oxide 104 is so controlled that the layer acts as an antireflective film for laser light. In consequence, the laser energy can be effectively afforded to the film.

EXAMPLE 2

Figure 3A:
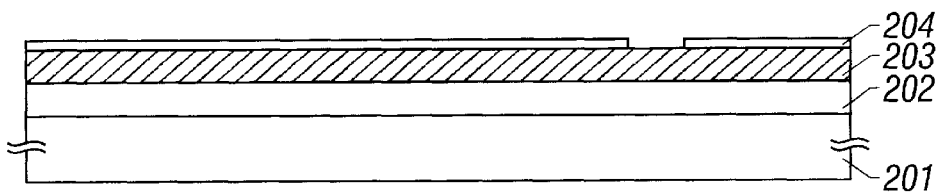
FIGS. 3(A)–3(F) and 4(A)–4(F) are cross-sectional views illustrating a process sequence for fabricating a TFT according to Example 2 of the present invention.

FIGS. 3(A)–3(F) and 4(A)–4(F) are cross-sectional views illustrating a process sequence for fabricating a TFT according to Example 2. As shown in FIG. 3(A), a glass substrate 201 made of Corning 1737 or Corning 7059 is prepared, and a silicon oxide film is formed as a buffer layer 202 on the substrate to a thickness of 1000 to 5000 Å, e.g., 1200 Å. Then, an amorphous silicon film 203 is formed to a thickness of 500 Å by plasma CVD. Preferably, the buffer layer 202 and the amorphous silicon film 203 are formed in succession.

Subsequently, a silicon thermal oxide film 204 is formed on the surface of the amorphous silicon film 203 to a thickness of tens of angstroms. The thermal oxidation conditions such as ambient and pressure may be appropriately selected. However, it is necessary to control the heating temperature and heating time in such a way that the amorphous silicon film 203 is not crystallized and that the glass substrate 201 is not deformed. The characteristics of the interface between the amorphous silicon film 203 and the silicon thermal oxide film 204 formed by this oxidation step are well maintained until the final TFT is obtained. Consequently, the characteristics of the TFT can be improved.

Then, a silicon oxide film 205 is formed on the surface of the silicon thermal oxide film 204 by plasma CVD or LPCVD. The silicon thermal oxide film 204 and the silicon oxide film 205 together form a masking layer when a metal element is introduced. During laser annealing, they serve as an antireflective film for laser light. For these purposes, it is necessary to control the thickness of the lamination of the silicon thermal oxide film 204 and the silicon oxide film 205 according to the wavelength of the used laser light.

Figure 3B:
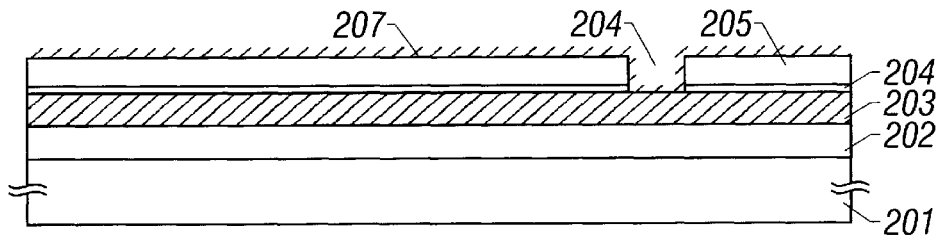

As shown in FIG. 3(B), the silicon oxide film 205 and the silicon thermal oxide film 204 are etched to form a rectangular hole 206 extending vertical to the plane of the figure. At this time, alignment markers used after the formation of the active layer can be formed.

Then, the surface of the amorphous silicon film 203 which is exposed through the hole 206 in the silicon oxide film 205 is oxidized to form a thin oxide film (not shown) having a thickness of approximately 10 to 50 Å. This oxide film improves the surface characteristics of the amorphous silicon film 203. As a result, the film no longer repels aqueous solution. The thin oxide film can be formed by ultraviolet radiation within an oxygen ambient or immersing the substrate in ozone water or hydrogen peroxide water.

Under this condition, a solution containing nickel which is a metal element accelerating crystallization of silicon is applied. In the present example, aqueous solution containing 1 to 100 ppm of nickel acetate is applied by spin coating to form an extremely thin nickel acetate film 207. As a result, nickel is maintained in contact with the surface of the amorphous silicon film 203 in the hole 206a within the silicon oxide film 205.

Figure 3C:
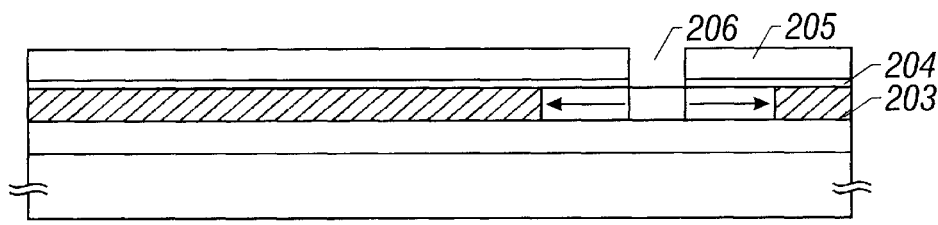

As shown in FIG. 3(C), a heat-treatment is performed at 550° C. for 8 hours in a nitrogen ambient. The thin nickel acetate film 207 is decomposed at 400° C., so that nickel element is diffused into the amorphous silicon film 203 through the hole 206. Concomitantly, the amorphous silicon film 203 is crystallized laterally as indicated by the arrows, thus forming a crystalline silicon film 208.

Figure 3D:
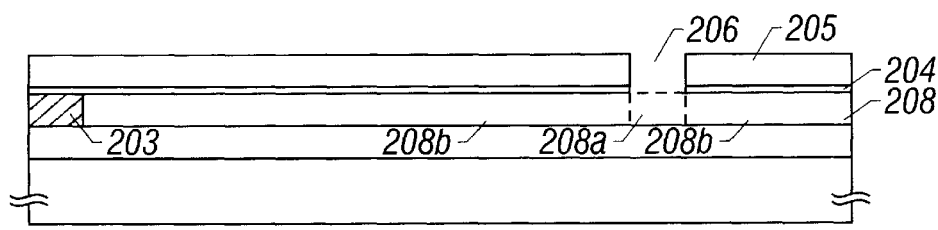

As shown in FIG. 3(D), in a region 208a of the crystalline silicon film 208 located immediately under the hole 206, crystals have been grown vertically. In its surrounding region 208b, crystals have been grown laterally.

As shown in FIG. 3(D), laser annealing is performed without removing the silicon thermal oxide film 204 or the silicon oxide film 205 to improve the crystallinity of the crystalline silicon film 208. In the present example, laser light having a wavelength of 248 nm is emitted from a KrF excimer laser or laser light having a wavelength of 304 nm is emitted from an XeCl excimer laser. At this time, formation of ridges is suppressed by the existence of a capping layer on the surface of the crystalline silicon film 208, the capping layer consisting of the silicon thermal oxide film 204 and the silicon oxide film 205. Since the thickness of the lamination of the silicon thermal oxide film 204 and the silicon oxide film 205 is set to 500 Å, the lamination film acts as an antireflective film for light having a wavelength of 248 nm, as shown in FIG. 5. Hence, the laser energy can be efficiently given to the crystalline silicon film 208.

Before the laser annealing step, the surface of the silicon oxide film 205 which is heavily doped with nickel may be removed to a depth of tens of angstroms to hundreds of angstroms. In this case, the surface is first cleaned by a megasonic process and etched with diluted HF solution. The etching is conducted to a depth so that the lamination of the silicon thermal oxide film 204 and the silicon oxide film 205 acts as an antireflective film for used laser light. Therefore, the thickness of the silicon oxide film 205 may be determined, taking account of the amount of the film removed by this etching step.

Figure 3E:
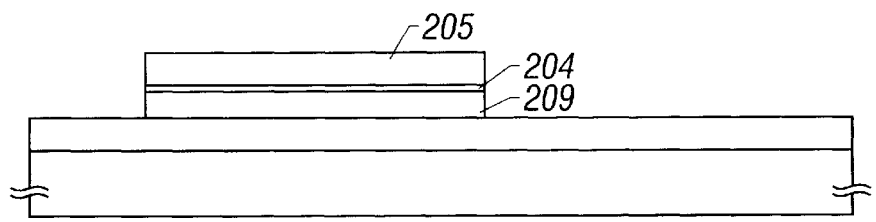

Then, as shown in FIG. 3(E), the crystalline silicon film 208 is etched into islands while the silicon thermal oxide film 204 and the silicon oxide film 205 are laminated, thus forming an active layer 209. The etched lamination film of the silicon thermal oxide film 204 and the silicon oxide film 205 constitutes a gate-insulating film.

Figure 3F:
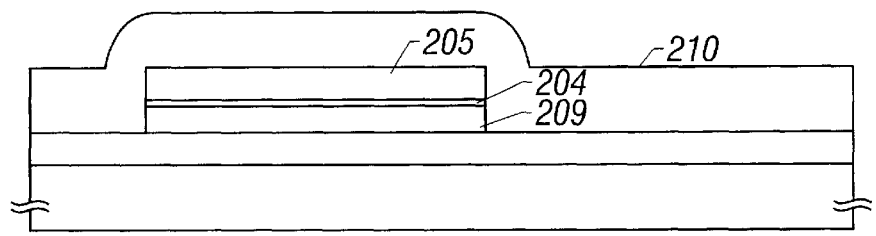

As shown in FIG. 3(F), after the end of the etching, a silicon oxide film 210 is formed to a thickness of 1000 Å by plasma CVD or LPCVD. These silicon thermal oxide film 204 and silicon oxide films 205, 210 together form the gate-insulating film.

Figure 4A:
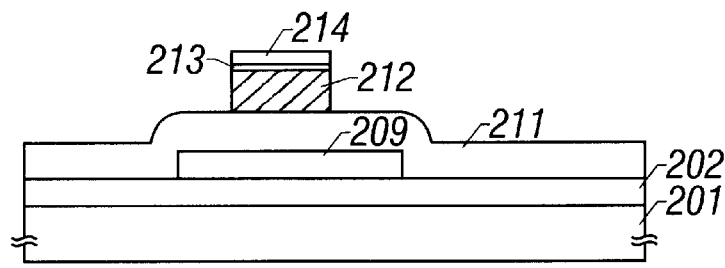

As shown in FIG. 4(A), an aluminum film for forming a gate electrode 212 is formed on the surface of a lamination film 211 consisting of the silicon thermal oxide film 204 and the silicon oxide films 205, 210 to a thickness of 5000 Å by sputtering techniques and patterned. Formation of hillocks and whiskers is prevented during heating steps and other later steps by previously adding 0.2% by weight of scandium to the aluminum.

Then, the surface of the aluminum film is anodized to form an extremely thin, dense anodic oxide film 213. This is followed by formation of a resist mask 214 on the surface of the aluminum film. Since the dense anodic oxide 213 is present on the surface of the aluminum film, the resist mask 214 can be formed in intimate contact with the surface. Using the resist mask 214, the aluminum film is etched to form the gate electrode 212.

Figure 4B:
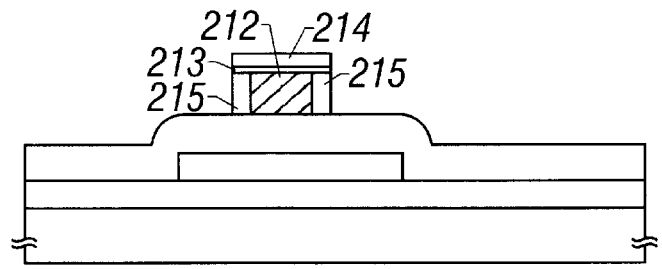

As shown in FIG. 4(B), the gate electrode 212 is anodized while leaving the resist mask 214 behind. Thus, a porous anodic oxide 215 is formed on the side surfaces of the gate electrode 212 to a thickness of 4000 Å.

Figure 4C:
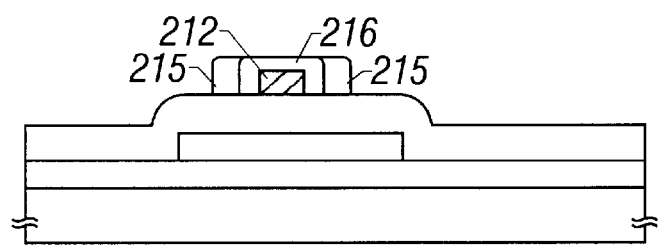

As shown in FIG. 4(C), the resist mask 214 is peeled off. The gate electrode 212 is again anodized within an electrolytic solution to form a dense anodic oxide 216 to a thickness of 1000 Å.

The anodic oxide can be formed differently by changing the used electrolytic solution. Where the porous anodic oxide 215 is formed, an acidic solution containing 3–20% citric acid, oxalic acid, chromic acid, or sulfuric acid is used as the electrolytic solution. On the other hand, where the dense anodic oxide 216 is formed, an electrolytic solution prepared by adjusting the pH of an ethylene glycol solution containing 3–10% tartaric acid, boric acid, or nitric acid to about 7 is used.

Figure 4D:
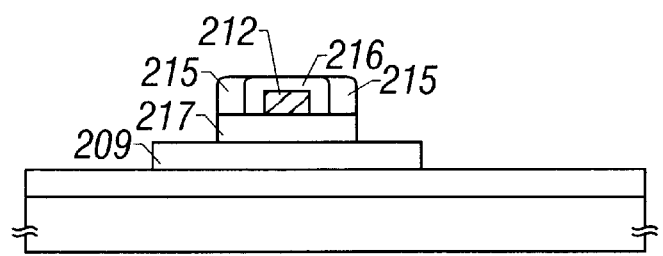

As shown in FIG. 4(D), using the gate electrode 212, its surrounding porous anodic oxide 215, and the dense anodic oxide 216 as a mask, the lamination film 211 consisting of the silicon thermal oxide film 204 and silicon oxide films 205, 210 is etched to form a gate-insulating film 217.

Figure 4E:
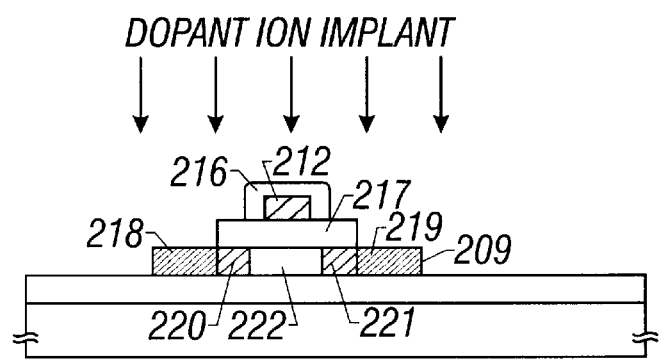

As shown in FIG. 4(E), the porous anodic oxide 215 is removed. Using the gate electrode 212, the dense anodic oxide 216, and the gate-insulating film 217 as a mask, dopant ions are implanted into the active layer 209 by ion implantation techniques. In the present example, where a P-channel TFT is formed, phosphine (PH$_3$) is used as a dopant gas in introducing phosphorus ions.

In the ion implantation step, those regions which are not coated with the gate-insulating film 217 are heavily doped with the dopant to form a source region 218 and a drain region 219 since the gate-insulating film 217 act as a semitransparent mask. In the regions masked only with the gate-insulating film 217, lightly doped regions 220 and 221 are formed. No dopant ions are introduced into the region located immediately under the gate electrode 212 and so a channel region 222 is formed.

Since the lightly doped regions 220 and 221 act as high-resistivity regions, they contribute to a decrease in the off current. The lightly doped region 221 on the side of the drain region 219 is termed an LDD (lightly doped drain) region. The region just under the dense anodic oxide 216 can be made to act as an offset region by making the dense anodic oxide 216 sufficiently thick. In this case, the off current can be reduced further.

Figure 4F:
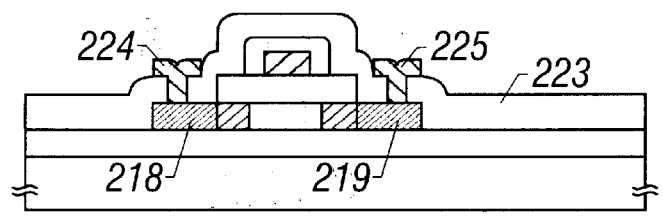

After the ion implantation step, a silicon oxide film is formed as an interlayer dielectric 223 to a thickness of 5000 Å by plasma CVD, as shown in FIG. 4(F). Instead of the single layer of silicon oxide, the interlayer dielectric 223 may be made of a single layer of silicon nitride or multilayer film of silicon oxide and silicon nitride.

Then, the interlayer dielectric 223 consisting of a film of silicon oxide is etched by dry etching techniques to form contact holes in the source region 218 and in the drain region 219. An aluminum film is formed over these contact holes to a thickness of 4000 Å and etched to form an upper metallization layer and electrodes, 224 and 225. Finally, the laminate is heat-treated at a temperature of 350° C. in a hydrogen ambient, thus completing the TFT.

In the present example, the surface of the active layer 209 (crystalline silicon film 208) is not exposed during a time interval between the instant when the silicon oxide 204 is formed and the instant when the TFT is completed.

In the present example, a thermal oxide film is grown on the surface of the active layer 209. Consequently, the characteristics of the interface between the gate-insulating film and the active layer can be improved further. Hence, a TFT having better characteristics can be derived.

Also in the present example, during the laser annealing, the lamination of the silicon thermal oxide film 204 and the silicon oxide film 205 is made to act as a capping layer for suppressing formation of ridges. At the same time, the thickness of the lamination layer is so controlled that the layer serves as an antireflective film for the used laser light having a given wavelength. Hence, the laser energy can be efficiently given to the crystalline silicon film 208.

EXAMPLE 3

The present example is described by referring to FIGS. 1(A)–1(E). As shown in FIG. 1(A), a silicon oxide film is formed as a buffer layer 102 on a glass substrate 101 to a thickness of 3000 Å by sputtering techniques. Then, an amorphous silicon film 103 is formed on the buffer layer to a thickness of 500 Å by plasma CVD or LPCVD.

Then, a silicon oxide film 104 is formed by plasma CVD or LPCVD. Preferably, the buffer layer 102, the amorphous silicon film 103, and the silicon oxide film 104 are formed in succession. Because the interface between the amorphous silicon film 103 and the silicon oxide film 104 is retained as it is until the final TFT is completed, and because the characteristics of this interface affect the characteristics of the TFT, it is necessary to form the amorphous silicon film 103 and the silicon oxide film 104 with special care.

Then, a rectangular hole 104a extending normal to the plane of the figure is formed in the silicon oxide film 104 by a well-known etching process. During this etching process, alignment markers which act as indicia after the formation of the active layer can be formed.

The surface of the amorphous silicon film 103 which is exposed through the hole 104a in the silicon oxide film 104 is oxidized to form a thin oxide film (not shown) having a thickness of about 10 to 50 Å. This thin oxide film improves the surface characteristics of the amorphous silicon film 103 and thus the amorphous silicon film no longer repels water solution. The thin oxide film can be formed by ultraviolet radiation within an oxygen ambient or immersing the substrate in ozone water or hydrogen peroxide water.

Then, aqueous solution containing 1 to 100 ppm of nickel acetate is applied by spin coating to form an extremely thin nickel acetate film 105. As a result, nickel is maintained in contact with the surface of the amorphous silicon film 103 in the hole 104a within the silicon oxide film 104.

As shown in FIG. 1(B), a heat-treatment is performed at 550° C. for 4 hours in a nitrogen ambient. The thin nickel acetate film 105 is decomposed at 400° C., so that nickel element is diffused into the amorphous silicon film 103 through the hole 104a in the silicon oxide film 104. At this time, the amorphous silicon film 103 is crystallized laterally as indicated by the arrows, thus forming a crystalline silicon film 106. As shown in FIG. 1(C), in a region 106a of the crystalline silicon film 106 that is located immediately under the thin nickel acetate film 105, crystals have been grown vertically. In its surrounding region 106b, crystals have been grown laterally.

As shown in FIG. 1(D), the crystalline silicon film 106 is etched together with the silicon oxide film 104 to form an active layer 107. The etched silicon oxide film 104 acts as a gate-insulating film. After the end of the etching, a silicon oxide film 109 is formed to a thickness of 1000 Å by plasma CVD or LPCVD. These silicon oxide films 104 and 109 together form the gate-insulating film.

Subsequently, the TFT is completed either by the TFT fabrication method of Example 1 described already in connection with FIGS. 2(A)–2(D) or by the TFT fabrication method of Example 2 previously described in conjunction with FIGS. 4(A)–4(F).

In the present example, laser annealing is not performed after the crystallization step and, therefore, it is sufficient that the silicon oxide film 104 forming the bottom layer of the gate-insulating film has a thickness with which the silicon oxide film 104 acts as a barrier film when nickel acetate solution is applied. Furthermore, the silicon oxide film 104 may be formed by thermally oxidizing the amorphous silicon film 103. In this case, if the silicon oxide film 104 is not sufficiently thick, a silicon oxide film and a silicon nitride film may be deposited on the surface of the thermal oxide film to a desired total thickness by plasma CVD or LPCVD.

In the present example, the bottom layer of the gate-insulating film is made of the silicon oxide film 104. The bottom layer may also be made of a silicon nitride film. Furthermore, instead of the silicon oxide 109 forming the top layer of the gate-insulating film, a silicon nitride film may be deposited.

In the present example, the surface of the active layer 107 (crystalline silicon film 106) is not exposed during a time interval between the instant when the silicon oxide 104 is formed and the instant when the TFT is completed. Therefore, the surface is prevented from getting contaminated. Furthermore, the layer (the barrier film) can be made to act as a capping layer which suppresses formation of ridges that would normally be generated by laser annealing.

In the novel semiconductor device fabrication method, the first dielectric layer forming the bottom layer of a gate-insulating layer is made to act as a barrier film when a metal element is introduced into an amorphous silicon film. Even after a silicon film forming an active layer is crystallized, the surface is masked with the first dielectric layer and so the surface of the crystalline silicon film is prevented from being contaminated.

Especially, if an amorphous silicon film is thermally oxidized such that the first dielectric film is made of a silicon thermal oxide film, the characteristics of the interface between the active layer (crystalline silicon film) and the gate-insulating film (first dielectric film) can be made better than those of the interface between the crystalline silicon and CVD-grown silicon oxide film.

In a further feature of the invention, laser annealing is performed while the first insulating film is left on the surface of the crystalline silicon. Consequently, formation of ridges can be suppressed. Moreover, the first dielectric film can be used as an antireflective film for laser light by appropriately controlling the thickness of the first dielectric film. Hence, the laser annealing can be carried out efficiently.

What is claimed is:

1. A method of fabricating semiconductor devices, comprising the steps of:
   forming an amorphous silicon film on an insulating substrate;
   forming a first dielectric film on said amorphous silicon film;
   forming holes in said dielectric film to selectively expose a surface of said amorphous silicon film;
   introducing a metal element into said amorphous silicon film from said exposed surface;
   crystallizing said amorphous silicon film by catalytic action of the metal element to form a crystalline silicon film;
   illuminating said crystalline silicon film with laser light;
   etching said crystalline silicon film into islands while leaving said dielectric film on said crystalline silicon film to form an active layer; and
   forming a second dielectric film, wherein said laser light is emitted by a KrF excimer laser, and wherein said first dielectric film is made of silicon oxide and has a thickness of 300 to 600 Å.

2. The method of claim 1, wherein said laser light is emitted by a KrF excimer laser, and wherein said first dielectric film is made of silicon nitride and has a thickness of 250 to 500 Å.

3. The method of claim 1, wherein said laser light is emitted by an XeCl excimer laser, and wherein said first dielectric film is made of silicon oxide and has a thickness of 400 to 700 Å.

4. The method of claim 1, wherein said laser light is emitted by an XeCl excimer laser, and wherein said first dielectric film is made of silicon nitride and has a thickness of 350 to 600 Å.

5. The method of claim 1, wherein during said step of forming said dielectric films, silicon oxide is formed at least at an interface with said amorphous silicon film by thermal oxidation.

6. The method of claim 1, wherein one or more elements selected from the group consisting of Fe, Co, Ni, Ru, Rh, Pd, Os, Ir, Pt, Cu, and Au is used as said metal element.

7. A method of fabricating semiconductor devices, comprising the steps of:
   forming an amorphous silicon film on an insulating substrate;
   forming a first dielectric film on said amorphous silicon film to a thickness sufficient for said first dielectric film to act as an antireflective film for laser light having a given wavelength;
   forming holes in said dielectric film to selectively expose a surface of said amorphous silicon film;
   introducing a metal element into said amorphous silicon film from said exposed surface;
   crystallizing said amorphous silicon film by catalytic action of said metal element to form a crystalline silicon film;
   illuminating said crystalline silicon film with said laser light;
   etching said crystalline silicon film into an island while leaving said dielectric film on said crystalline silicon film to form an active layer; and
   forming a second dielectric film.

8. The method of claim 7, wherein said laser light is emitted by a KrF excimer laser, and wherein said first dielectric film is made of silicon oxide and has a thickness of 300 to 600 Å.

9. The method of claim 7, wherein said laser light is emitted by a KrF excimer laser, and wherein said first dielectric film is made of silicon nitride and has a thickness of 250 to 500 Å.

10. The method of claim 7, wherein said laser light is emitted by an XeCl excimer laser, and wherein said first dielectric film is made of silicon oxide and has a thickness of 400 to 700 Å.

11. The method of claim 7, wherein said laser light is emitted by an XeCl excimer laser, and wherein said first dielectric film is made of silicon nitride and has a thickness of 350 to 600 Å.

12. The method of claim 7, wherein during said step of forming said dielectric films, silicon oxide is formed at least at an interface with said amorphous silicon film by thermal oxidation.

13. The method of claim 7, wherein one or more elements selected from the group consisting of Fe, Co, Ni, Ru, Rh, Pd, Os, Ir, Pt, Cu, and Au is used as said metal element.

14. A method of fabricating semiconductor devices, comprising the steps of:
   forming a first dielectric film on an amorphous silicon film to a thickness sufficient for said first dielectric film to act as an antireflective film for laser light having a given wavelength, said first dielectric film forming a bottom layer of a gate-insulating film, said thickness of said first dielectric film being less than thickness of said gate-insulating film;
   forming holes in said dielectric film to selectively expose a surface of said amorphous silicon film;
   introducing a metal element into said amorphous silicon film from said exposed surface;
   crystallizing said amorphous silicon film to form a crystalline silicon film;
   illuminating said crystalline silicon film with said laser light;
   etching said crystalline silicon film into an island while leaving said dielectric film on said crystalline silicon film to form an active layer; and
   forming a second dielectric film which forms a top layer of said gate-insulating film,
   wherein said gate-insulating film comprises a laminate of said first dielectric film and said second dielectric film.

15. The method of claim 14, wherein said laser light is emitted by a KrF excimer laser, and wherein said first dielectric film is made of silicon oxide and has a thickness of 300 to 600 Å.

16. The method of claim 14, wherein said laser light is emitted by a KrF excimer laser, and wherein said first dielectric film is made of silicon nitride and has a thickness of 250 to 500 Å.

17. The method of claim 14, wherein said laser light is emitted by an XeCl excimer laser, and wherein said first dielectric film is made of silicon oxide and has a thickness of 400 to 700 Å.

18. The method of claim 14, wherein said laser light is emitted by an XeCl excimer laser, and wherein said first dielectric film is made of silicon nitride and has a thickness of 350 to 600 Å.

19. The method of claim 14, wherein during said step of forming said dielectric films, silicon oxide is formed at least at an interface with said amorphous silicon film by thermal oxidation.

20. The method of claim 14, wherein one or more elements selected from the group consisting of Fe, Cop, Ni, Ru, Rh, Pd, Os, Ir, Pt, Cu, and Au is used as said metal element.

21. A method of fabricating semiconductor devices, comprising the steps of:
   forming an amorphous silicon film on an insulating substrate;
   forming a first dielectric film on said amorphous silicon film;
   forming holes in said dielectric film to selectively expose a surface of said amorphous silicon film;
   introducing a metal element into said amorphous silicon film from said exposed surface;
   crystallizing said amorphous silicon film by catalytic action of the metal element to form a crystalline silicon film;
   removing a surface portion of said first dielectric film heavily doped with said metal element;
   illuminating said crystalline silicon film with laser light;
   etching said crystalline silicon film into an island while leaving said dielectric film on said crystalline silicon film to form an active layer; and
   forming a second dielectric film.

22. The method of claim 21, wherein one or more elements selected from the group consisting of Fe, Co, Ni, Ru, Rh, Pd, Os, Ir, Pt, Cu, and Au are used as said metal element.

23. A method of fabricating semiconductor devices, comprising the steps of:
   forming an amorphous silicon film on an insulating substrate;
   forming a first dielectric film on said amorphous silicon film;
   forming holes in said first dielectric film to selectively expose a surface of said amorphous silicon film;
   introducing a metal element into said amorphous silicon film from said exposed surface;
   crystallizing said amorphous silicon film by catalytic action of the metal element to form a crystalline silicon film;
   illuminating said crystalline silicon film with a laser light;
   removing a surface portion of said first dielectric film heavily doped with said metal element;
   etching said crystalline silicon film into an island while leaving said dielectric film on said crystalline silicon film to form an active layer; and
   forming a second dielectric film,
   wherein said first dielectric film is reduced to a thickness sufficient to act as an antireflective film for said laser light, by said removing step.

24. The method of claim 23, wherein one or more elements selected from the group consisting of Fe, Co, Ni, Ru, Rh, Pd, Os, Ir, Pt, Cu, and Au are used as said metal element.

* * * * *